(12) United States Patent
Kim et al.

(10) Patent No.: US 10,608,615 B2
(45) Date of Patent: Mar. 31, 2020

(54) SEMICONDUCTOR DEVICE INCLUDING RETENTION RESET FLIP-FLOP

(71) Applicant: Samsung Electronics Co., Ltd., Suwon-si, Gyeonggi-do (KR)

(72) Inventors: Jong Woo Kim, Osan-si (KR); Ju Hyun Kang, Hwaseong-si (KR); Min Su Kim, Hwaseong-si (KR); Ka Ram Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/417,339

(22) Filed: Jan. 27, 2017

(65) Prior Publication Data

US 2017/0222630 A1 Aug. 3, 2017

(30) Foreign Application Priority Data

Jan. 28, 2016 (KR) .................. 10-2016-0010986
Apr. 8, 2016 (KR) .................. 10-2016-0043525

(51) Int. Cl.
*H03K 3/012* (2006.01)
*H03K 3/3562* (2006.01)

(52) U.S. Cl.
CPC ......... *H03K 3/012* (2013.01); *H03K 3/35625* (2013.01)

(58) Field of Classification Search
CPC ............ H03K 3/00; H03K 3/01; H03K 3/012; H03K 3/353; H03K 3/356; H03K 3/35625

(Continued)

(56) References Cited

U.S. PATENT DOCUMENTS 7,183,825 B2    2/2007  Padhye et al.
7,301,381 B2   11/2007  Rhee et al.
(Continued)

FOREIGN PATENT DOCUMENTS

JP    2004/064557 A    2/2004
KR    2009/0040519 A   4/2009
KR          1165730     7/2011

OTHER PUBLICATIONS

U.S. Office Action dated Dec. 26, 2018 in corresponding U.S. Appl. No. 15/399,146.

(Continued)

*Primary Examiner* — Lincoln D Donovan
*Assistant Examiner* — Diana J. Cheng
(74) *Attorney, Agent, or Firm* — Harness, Dickey and Pierce, P.L.C.

(57) ABSTRACT

A semiconductor device may include a master latch that stores an input data signal, using a local power supply voltage and a clock signal, and outputs the input data signal to a first output signal; a slave latch that stores the first output signal, using a global power supply voltage, the clock signal and a retention signal, and outputs a second output signal; a first logic gate that receives input of one signal and another signal of the retention signal, the clock signal and the reset signal, and outputs a first control signal generated by performing a first logical operation; and a second logic gate that receives input of the rest of the retention signal, the clock signal and the reset signal, and the first control signal, and performs a second logical operation to at least one of the master latch and the slave latch.

17 Claims, 12 Drawing Sheets

(58) Field of Classification Search
USPC .......................................... 327/198, 202, 203
See application file for complete search history.

(56) References Cited

U.S. PATENT DOCUMENTS

| | | | |
|---|---|---|---|
| 7,652,513 B2 | 1/2010 | Rao et al. | |
| 7,772,906 B2 | 8/2010 | Naffziger | |
| 7,948,263 B2 | 5/2011 | Kim et al. | |
| 7,982,514 B2 | 7/2011 | Biyani | |
| 8,013,628 B2 | 9/2011 | Lee et al. | |
| 8,018,247 B2 | 9/2011 | Priel et al. | |
| 8,085,076 B2 | 12/2011 | Djaja et al. | |
| 8,355,293 B2 | 1/2013 | van Winkelhoff et al. | |
| 8,381,163 B2 | 2/2013 | Schreiber et al. | |
| 8,451,039 B2 | 5/2013 | Myers et al. | |
| 8,854,077 B2 | 10/2014 | Hoberman et al. | |
| 8,994,431 B2 | 3/2015 | Chang | |
| 9,081,061 B1 | 7/2015 | Agarwal et al. | |
| 9,099,998 B2 | 8/2015 | Bartling et al. | |
| 9,473,113 B1 * | 10/2016 | Pant | H03K 3/012 |
| 9,542,994 B1 * | 1/2017 | Prabhat | G11C 11/417 |
| 2009/0066386 A1 | 3/2009 | Lee | |
| 2014/0075087 A1 * | 3/2014 | Bartling | G06F 13/00 711/102 |
| 2015/0200651 A1 | 7/2015 | Baratam | |

OTHER PUBLICATIONS

Notice of Allowance dated Apr. 17, 2019 in corresponding U.S. Appl. No. 15/399,146.
U.S. Appl. No. 15/399,146, filed Jan. 5, 2017.

* cited by examiner

19

SEMICONDUCTOR DEVICE INCLUDING RETENTION RESET FLIP-FLOP

This application claims priority from Korean Patent Application No. 10-2016-0010986 filed on Jan. 28, 2016 and Korean Patent Application No. 10-2016-0043525 filed on Apr. 8, 2016 in the Korean Intellectual Property Office, the disclosures of each of which are incorporated herein by reference in their entirety.

BACKGROUND

1. Field

Example embodiments of the presentinventive concepts relate to a semiconductor device that includes a retention reset flip-flop.

2. Description of the Related Art

For the design of the low-power semiconductor chips, a power gating technique for reducing a leakage current by shutting off a power supply to blocks of a circuit that are not in use is widely used. In order to use such a power gating technique, when shutting off the power supply, data in a data storage flip-flop may be transferred to another location, and a method of shutting off the power supply after transferring the data out of the data storage flip-flop may be used.

A discrete circuit and/or logic may be used to perform a reset function on the retention flip-flop. However, this discrete circuit and/or logic may increase the size of the retention flip-flop and also may increase power consumption. Therefore, there is a need for a low-power small retention flip-flop.

SUMMARY

Some example embodiments of the inventive concepts relate to a semiconductor device in which the size of the product can be reduced and the power consumption can be reduced.

However, example embodiments of the inventive concepts are not restricted to the one set forth herein. The above and other aspects of the example embodiments of the inventive concepts will become more apparent to one of ordinary skill in the art to which the inventive concepts pertains by referencing the detailed description of the example embodiments of the inventive concepts given below.

According to some example embodiments of the inventive concepts, there is provided a semiconductor device that includes a master latch that stores an input data signal using a local power supply voltage and a clock signal and outputs the input data signal to a first output signal; a slave latch that stores the first output signal using a global power supply voltage different from the local power supply voltage, the clock signal and a retention signal, and outputs the first output signal to a second output signal; a first logic gate that receives input of one signal and another signal of the retention signal, the clock signal and the reset signal, and outputs a first control signal generated by performing a first logical operation; and a second logic gate that receives input of the rest of the retention signal, the clock signal and the reset signal, and the first control signal, and provides a second control signal generated by performing a second logical operation to at least one of the master latch and the slave latch.

According to some example embodiments of the inventive concepts, there is provided a semiconductor device that includes a first line to which a global power supply voltage is applied; a second line which is separated from the first line and to which the local power supply voltage is applied; a first operating circuit that is connected to the second line and uses the local power supply voltage; a first power gating circuit that determines whether to apply the local power supply voltage to the first operating circuit; and a first retention reset flip-flop connected to the first line and the second line, wherein the first retention reset flip-flop includes a master latch, a slave latch and a logic gate. The master latch is connected to the second line, stores the input data signal, using the clock signal, the retention signal and the reset signal, and outputs the data signal to a first output signal. The slave latch is connected to the first line, stores the first output signal, using the clock signal, the retention signal and the reset signal, and outputs the first output signal to a second output signal. The logic gate receives the input of the retention signal, the clock signal and the reset signal and provides a control signal generated by performing the logical operation to at least one of the master latch and the slave latch.

According to some example embodiments of the inventive concepts, there is provided a semiconductor device that includes a master latch that stores an input data signal using a local power supply voltage, and outputs the data signal to a first output signal; a slave latch that stores the first output signal using a global power supply voltage different from the local power supply voltage, and outputs the first output signal to a second output signal; and a logic gate that receives the provision of first to third signals, and provides the global power supply voltage to at least one of the master latch and the slave latch, wherein the logic gate includes a first transistor that is gated by the first signal to provide the global power supply voltage to a first node, a second transistor that is gated by the first signal to provide a ground voltage to the first node, a third transistor that is gated by the second and third signals to provide the global power supply voltage to the first node, and a fourth transistor that is gated by the second and third signals to provide the ground voltage to the first node.

According to some example embodiments of the inventive concepts, there is provided a semiconductor device that includes a master latch that stores an input data signal, using a local power supply voltage and a clock signal, and outputs the data signal to a first output signal; a slave latch that stores the first output signal, using a global power supply voltage different from the local power supply voltage, the clock signal and a retention signal, and outputs the first output signal to a second output signal; a first logic gate that receives input of the retention signal, the clock signal and the reset signal, and provides a first logic signal generated by performing a first logical operation to at least one of the master latch and the slave latch; and a second logic gate that receives the provision of the second output signal and the reset signal to perforin a second logical operation.

Some example embodiments relate to semiconductor device.

In some example embodiments, the semiconductor device includes a power gating circuit configured to selectively supply a local power supply voltage to an operating circuit; and a retention reset flip-flop configured to, operate in a normal flip-flop mode to latch data using at least the local power supply voltage, when the power gating circuit supplies the local power supply voltage to the operating circuit, and operate in a retention mode to preserve the data using a global power supply voltage, when the power gating circuit cuts off the local power supply voltage to the operating circuit, the global power supply voltage being supplied via a different voltage source from the local power supply voltage.

BRIEF DESCRIPTION OF THE DRAWINGS

The above and other aspects and features of the inventive concepts will become more apparent by describing in detail example embodiments thereof with reference to the attached drawings, in which.

DETAILED DESCRIPTION

Figure 1:
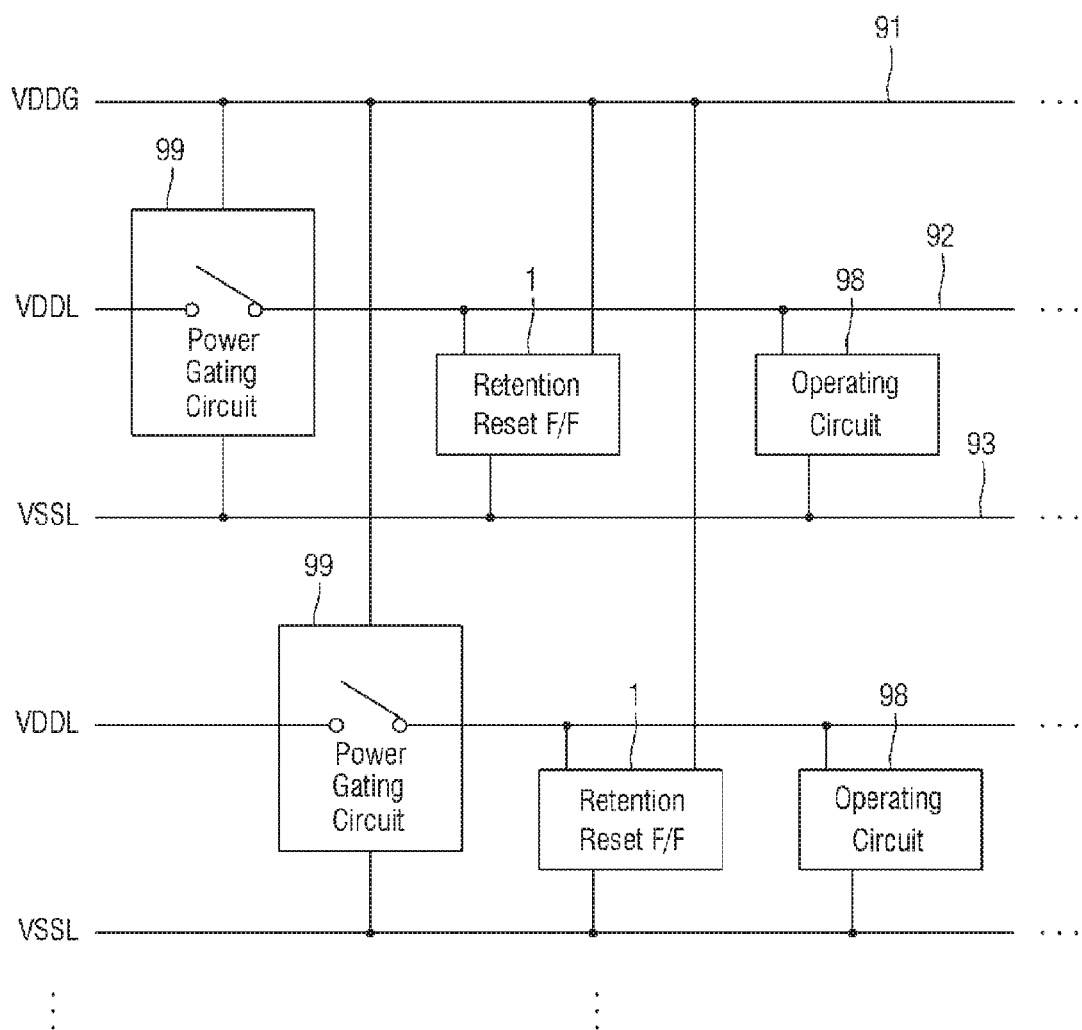
FIG. 1 is a conceptual block diagram of a semiconductor device according to some example embodiments of the inventive concepts.

Example embodiments will be described in detail with reference to the accompanying drawings. Example embodiments of inventive concepts, however, may be embodied in various different forms, and should not be construed as being limited only to the illustrated example embodiments. Rather, these example embodiments are provided as examples so that this disclosure will be thorough and complete, and will fully convey the inventive concepts to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Advantages and features of the present disclosure and methods of accomplishing the same may be understood more readily by reference to the following detailed description of preferred embodiments and the accompanying drawings.

FIG. 1 is a conceptual block diagram of a semiconductor device according to some example embodiments of the inventive concepts.

Referring to FIG. 1, the semiconductor device may include a retention reset flip-flop 1, an operating circuit 98 and a power gating circuit 99.

The operating circuit 98 may be connected between a local power supply voltage line 92 and a ground line 93 supplying a local power supply voltage VDDL and a ground voltage VSSL, respectively.

The power gating circuit 99 may be connected to a global power supply voltage line 91 supplying global power supply voltage VDDG and the ground line 93.

The power gating circuit 99 may determine whether to apply the local power supply voltage VDDL to the operating circuit 98. For example, the power gating circuit 99 may determine whether to apply the local power supply voltage VDDL to the operating circuit 98, by selectively disconnecting the operating circuit 98 from the local power supply voltage line 92 based on the global power supply voltage VDDG.

When the power gating circuit 99 applies the local power supply voltage VDDL to the operating circuit 98, the operating circuit 98 may be driven using the local power supply voltage VDDL, and when the power gating circuit 99 does not apply the local power supply voltage VDDL, to the operating circuit 98, the operating circuit 98 may not be driven.

In some example embodiments, the operating circuit 98 may include all circuits that are driven using the local power supply voltage VDDL. In some example embodiments, the operating circuit 98 may be used to perform operations based on a data signal.

The retention reset flip-flop 1 may be connected to the global power supply voltage line 91, the local power supply voltage line 92, and the ground line 93. The retention reset flip-flop 1 may serve to preserve the data, when the power gating circuit 99 shuts off the local power supply voltage VDDL.

For example, the retention reset flip-flop 1 may initially operate as a normal reset flip-flop, while the power gating circuit 99 applies the local power supply voltage VDD. Thereafter, the retention reset flip-flop 1 may serve to preserve the stored data using the global power supply voltage VDDG, when the power gating circuit 99 shuts off the local power supply voltage VDDL.

The retention reset flip-flop 1 according to the example embodiments operate as a normal reset flip-flop, using the local power supply voltage VDDL and the global power supply voltage VDDG, when the power gating circuit 99 applies the local power supply voltage VDDL Further, the retention reset flip-flop 1 may perform the retention operation, using the global power supply voltage VDDG, while the power gating circuit 99 shuts off the local power supply voltage VDDL. In some embodiments, the data stored in the retention reset flip-flop 1 while the power gating circuit 99 shuts off the local power supply voltage VDDL may be data used to operate the operating circuit 98 when the power gating circuit 99 applies the local power supply voltage VDDL again.

The local power supply voltage line 92 and the global power supply voltage line 91 may be disposed to be separated from each other as illustrated. The local power supply voltage VDDL may be provided to the local power supply voltage line 92, and the global supply voltage VDDG may be provided to the global power supply voltage line 91.

The global power supply voltage line 91 may be disposed at a position remote from the retention reset flip-flop 1, compared to the local power supply voltage line 92. Therefore, in some cases, even if the magnitude of the global power supply voltage VDDG applied to the global power supply voltage line 91 is the same as the magnitude of the local power supply voltage VDDL applied to the local power supply voltage line 92, the magnitude of the voltage provided to the retention reset flip-flop 1 may differ. That is, the magnitude of the global power supply voltage VDDG measured in the retention reset flip-flop 1 may be smaller than the magnitude of the local power supply voltage VDDL.

In some example embodiments, as illustrated, the semiconductor device may include a plurality of local power supply voltage lines 92 and ground lines 93. In this case, the semiconductor device may include a plurality of the retention reset flip-flops 1 and the operating circuits 98 each connected to each local power supply voltage line 92.

Further, the semiconductor device may include a plurality of power gating circuits 99 for determining the turning on/off of each local power supply voltage line 92.

Figure 2:
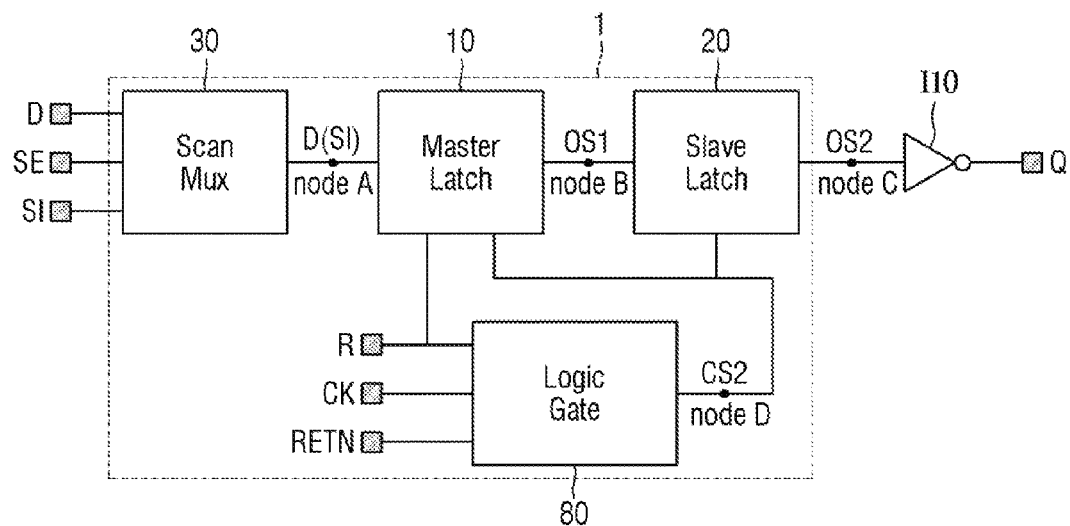
FIG. 2 is a block diagram of a retention reset flip-flop of FIG. 1.

FIG. 2 is a block diagram of the retention reset flip-flop of FIG. 1.

Referring to FIG. 2, the retention reset flip-flop 1 may include a master latch 10, a slave latch 20, a scan mux 30 and a logic gate 80.

The scan mux 30 may receive one or more of a data signal D, a scan enable signal SE, and a scan input signal SI. Further, the scan mux 30 may output any one of the data signal D and the scan input signal SI based on the control signal.

For example, the scan mux 30 may output the scan input signal SI when the scan enable signal SE is activated (e.g., when the scan enable signal SE of a high (H) logic is provided), and the scan mux 30 may output the data signal D when the scan enable signal SE is not activated (e.g., when the scan enable signal SE of a low (L) logic is provided).

When the scan input signal SI is output from the scan mux 30, the master latch 10 and the slave latch 20 may perform a scanning operation for latching and outputting the scan input signal SI, and when the scan data signal D is output from the scan mux 30, the master latch 10 and the slave latch 20 may perform a normal flip-flop operation for latching and outputting the data signal D.

The scan mux 30 may include a multiplexer or the like, but example embodiments of the present inventive concepts are not limited thereto.

The master latch 10 may store the input data signal using the local power supply voltage (VDDL, in FIG. 1), and may output the data signal to a first output signal OS1. For example, the master latch 10 may store the input data signal D using the local power supply voltage (VDDL in FIG. 1) based on the clock signal CK, and may output the data signal as the first output signal OS1. The specific operation of the master latch 10 will be described later.

The slave latch 10 may perform different operations depending on whether a retention signal RETN is activated.

When the retention signal REIN is not activated (e.g., when the retention signal RETN of a high (H) logic is provided), the slave latch 20 may store the first output signal OS1 output from the master latch 10 using the local power supply voltage (VDDL in FIG. 1) and may output the first output signal to a second output signal OS2. For example, the slave latch 20 may perform the normal flip-flop operation that stores the first output signal OS1 using the local power supply voltage (VDDL in FIG. 1) based on the clock signal CK, and outputs the first output signal to the second output signal OS2.

Thereafter, the second output signal OS2 may be inverted by an inverter I10 or the like and may be provided to an output terminal Q. However, example embodiments of the present inventive concepts are not limited thereto.

In example embodiments, the description will be given by defining a state in which the retention signal RETN is at a high (H) logic as a non-activated state, and by defining a state in which the retention signal RETN is at a low (L) logic as an activated state, but example embodiments of the present inventive concepts are not limited to these examples. In some other example embodiments of the present inventive concepts, the state in which the retention signal RET is a low (L) logic may be defined as a non-activated state, and the state in which the retention signal RET is a high (H) logic may be defined as an activated state.

Meanwhile, when the retention signal RETN is activated (e.g., when the retention signal RETN of low (L) logic is provided), the slave latch 20 may perform the retention operation for holding the stored data, using the global power supply voltage (VDDG in FIG. 1). The specific operation of the slave latch 20 will also be described later.

Meanwhile, the master latch 10 and the slave latch 20 may perform the reset operation, depending on whether a reset signal R is activated.

Specifically, when the reset signal R is not activated (e.g., when the reset signal R of low (L) logic is provided), the master latch 10 and the slave latch 20 may perform the normal flip-flop operation that stores the input data signal D based on the clock signal CK, and thereafter, outputs the data signal to the second output signal OS2. Meanwhile, when the reset signal R is activated (e.g., when the reset signal R of high (H) logic is provided), the master latch 10 and the slave latch 20 may perform the reset operation for outputting the second output signal OS2 of low (L) logic, irrespective of the input data signal D.

The logic gate 80 may serve to generate the second control signal CS2 such that the master latch 10 and the slave latch 20 can perform the retention operation and the reset operation described above. That is, in the retention reset flip-flop 1 according to example embodiments, the logic gate 80 may generate and provide the second control signal CS2 to the master latch 10 and the slave latch 20 such that the master latch 10 and the slave latch 20 may smoothly perform the retention operation and the reset operation. That is, since the circuit to perform the retention operation and the reset operation is refined, the size of the retention reset flip-flop 1 can be miniaturized, and the semiconductor device including the same can also be further miniaturized. Further, such a configuration can also reduce the power consumed during the flip-flop operation.

The logic gate 80 according to example embodiments may receive one or more of the reset signal R, the clock signal CK and the retention signal RETN and may perform a logical operation to generate the second control signal CS. Hereinafter, an example of the logic gate 80 according to example embodiments will be described with reference to FIG. 3.

Figure 3:
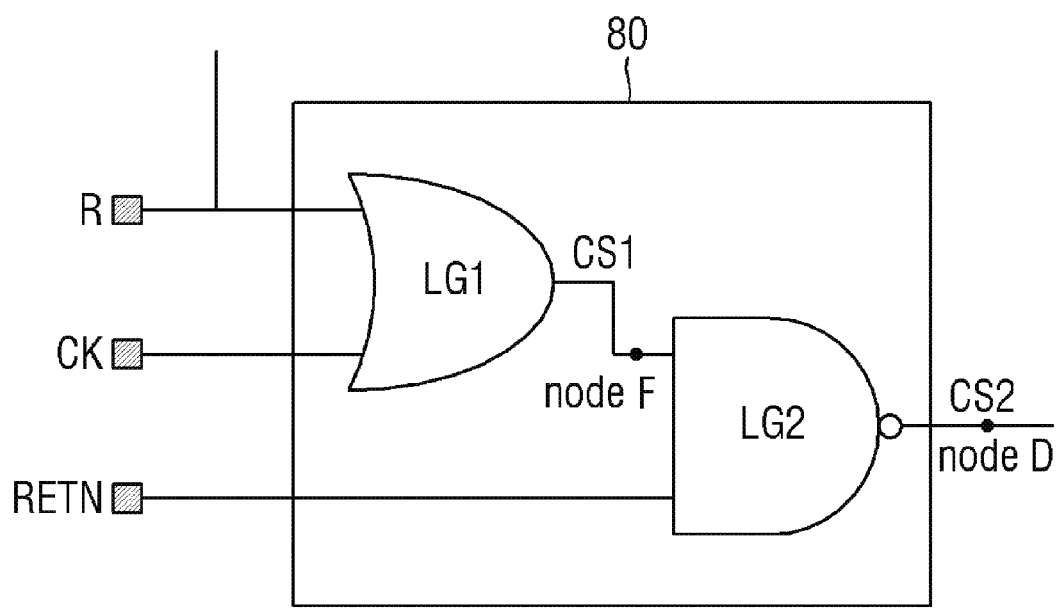
FIG. 3 is a block diagram of a logic gate of FIG. 2.

FIG. 3 is a block diagram of a logic gate included in the retention reset flip-flop of FIG. 2.

Referring to FIG. 3, the logic gate 80 may include a first logic gate LG1, and a second logic gate LG2.

The first logic gates LG1 may be, for example, an OR gate that performs an OR operation. Specifically, the first logic gate LG1 may receive the reset signal R and the clock signal CK, perform an OR operation depending on the signal level, and may output the result of the OR operation as the first control signal CS1.

The second logic gate LG2, for example, may be a NAND gate that performs a NAND operation. Specifically, the second logic gate LG2 may receive the first control signal CS1 output from the first logic gate LG1, and the retention signal RETN, perform a NAND operation depending on the signal level, output the result of the NAND operation as the second control signal CS2, and provide the second control signal CS2 to at least one of the master latch (10 in FIG. 2) and the slave latch (20 in FIG. 2).

Although FIG. 3 illustrates an OR gate for performing the OR operation of the reset signal R and the clock signal CK, and a NAND gate for performing the NAND operation of the output CS1 of the OR gate and the retention signal RETN as an example of the logic gate 80 according to example embodiments, example embodiments of the present inventive concepts are not limited thereto. If necessary, the internal configuration of the logic gate 80 may be provided by being modified in the other configurations.

Figure 4:
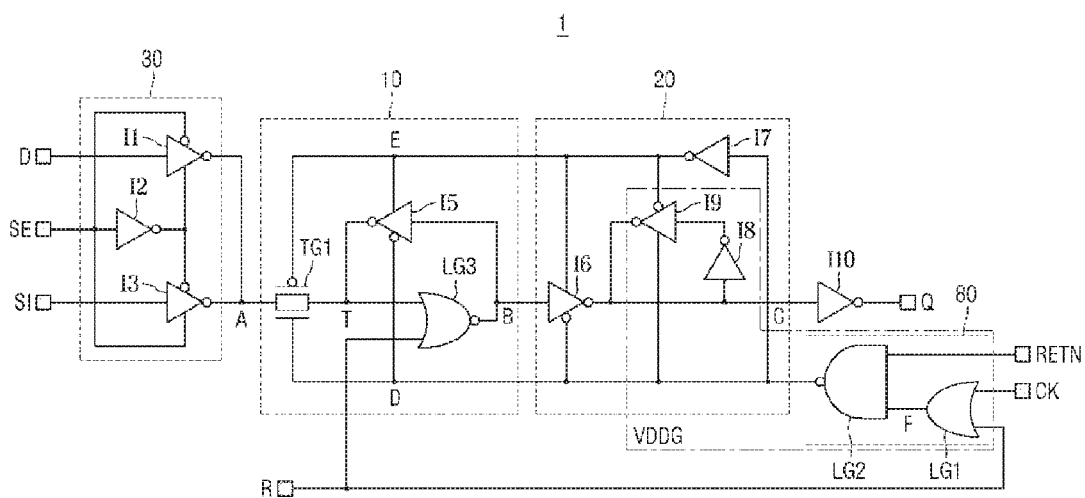
FIG. 4 is a circuit diagram of a retention reset flip-flop according to some example embodiments of the inventive concepts.
Figure 5:
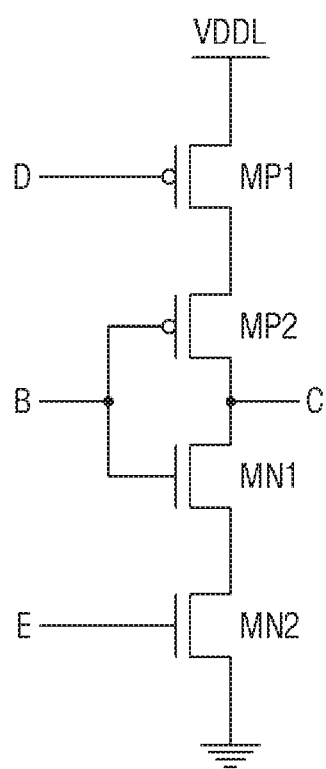
FIGS. 5 and 6 are circuit diagrams of an inverter of FIG. 4.
Figure 6:
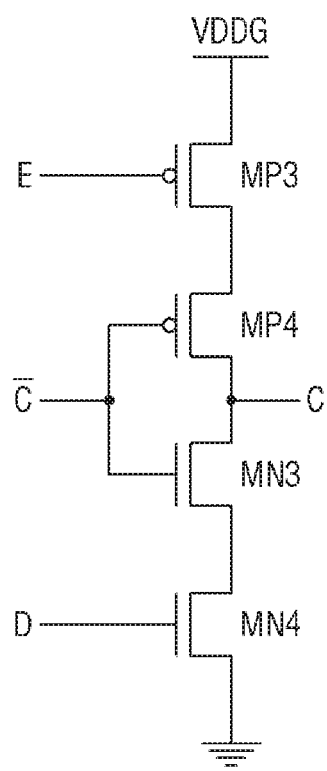

FIG. 4 is a circuit diagram of a retention reset flip-flop according to some example embodiments of the present inventive concepts. FIGS. 5 and 6 are circuit diagrams of the inverter of FIG. 4.

Referring to FIG. 4, the retention reset flip-flop 1 may include the master latch 10, the slave latch 20, the scan mux 30 and the logic gate 80.

The scan mux 30, for example, may include a plurality of inverters I1 to I3.

An inverter I2 may invert and output the scan enable signal SE. An inverter I1 may be controlled by the output of the inverter I1 and the scan enable signal SE, and may invert and output the data signal D. An inverter I3 is controlled by the output of the inverter I1 and the scan enable signal SE, and may invert and output the scan input signal SI.

Accordingly, the voltage level of the node A may be determined depending on the signal level of the scan enable signal SE. For example, when the scan enable signal SE is activated (SE=H), the voltage level of the node A may vary depending on the signal level of the scan input signal SI. That is, the scan input signal SI may be input to the master latch 10.

Further, when the scan enable signal SE is inactivated (SE=L), the voltage level of the node A may vary depending on the signal level of the data signal D. That is, the data signal D may be input to the master latch 10.

The master latch 10 may include a transfer gate TG1, an inverter I5 and a third logic gate LG3.

The transfer gate TG1 is controlled by the voltage level of the node E and the voltage level of the node D, and may provide the voltage of the node A to the node T.

The third logic gate LG3 performs the NOR operation of the voltage level of the node T and the reset signal R, and may provide the result to the node B. When the reset signal R is not activated (e.g., when the reset signal R of low (L) logic is provided), the third logic gate LG3 may serve as an inverter that inverts the voltage level of the node T and provides it to the node B. When the reset signal R is activated (e.g., when the reset signal R of high (H) logic is provided), the third logic gate LG3 may determine the voltage level of the node B to the low (L) logic, irrespective of the voltage level of the node T. Specific operations thereof will be described later.

The inverter I5 is controlled by the voltage level of the node E and the voltage level of the node D, may invert the voltage level of the node B and may provide it to the node T.

The slave latch 20 may include a plurality of inverters I6 to I9.

An inverter I6 is controlled by the voltage level of the node D and the voltage level of the node E, may invert the voltage level of the node B and may provide it to the node C. An inverter I7 may invert the voltage level of the node C and may provide it to the node E. An inverter I8 inverts the voltage level of the node C and provides it to an inverter I9, and the inverter I9 is controlled by the voltage level of the node E and the voltage level of the node D, may invert the output of the inverter I8, and may provide it to the node C.

The logic gate 80 may include a first logic gate LG1 and a second logic gate LG2.

The first logic gates LG1 may determine the voltage level of the node F, by receiving the reset signal R and the clock signal CK, and by, for example, performing an OR operation on the reset signal R and the clock signal CK depending on the signal level.

The second logic gate LG2 may determine the voltage level of the node D, by receiving voltage level of the node F and the retention signal RETN, and performing a NAND operation on the voltage of node F and the retention signal RETN depending on the voltage level or the signal level.

An inverter I10 may invert the output voltage level of the node C and may provide it to the node Q. In some other example embodiments of the present inventive concepts, the inverter I10 may be omitted.

The global power supply voltage VDDG is provided to the inverters I8 and I9 of the retention reset flip-flop 1, the first logic gate LG1 and the second logic gate LG2, and the local power supply voltage VDDL may be provided to other devices illustrated in FIG. 4. That is to say, the inverters I8 and I9 of the retention reset flip-flop 1, the first logic gate LG1 and the second logic gate LG2 are driven using the global supply voltage VDDG, and other devices may be driven using the local power supply voltage VDDL.

For example, referring to FIG. 5, the inverter I6 may include transistors MP1, MP2, MN1 and MN2 connected in series between the local power supply voltage VDDL and the ground voltage.

Specifically, the inverter I6 may include a transistor MP1 that is gated by the voltage level of the node D to transmit the local power supply voltage VDDL, to the node C, a transistor MP2 that is gated by the voltage level of the node B to transmit the local power supply voltage VDDL to the node C, a transistor MN1 that is gated by the voltage level of the node B to provide a ground voltage to the node C, and a transistor MN2 that is gated by the voltage level of the node E to provide a ground voltage to the node C.

Here, the meaning of the expression "the ground voltage is provided to the node C" may include a case of grounding the node C, and a case of providing a desired (or, alternatively, a predetermined) voltage (e.g., VSS) lower than the local power supply voltage VDDL to the node C. Hereinafter, in the present specification, the expression "the ground voltage is provided to a particular node" should be understood to include both of these meanings.

Although FIG. 5 illustrates only the inverter I6 as an example of a device that is driven using the local power supply voltage VDDL, other devices illustrated in FIG. 4 that utilize the local power supply voltage VDDL may also be driven by the local power supply voltage VDDL using the similar method. For example, inverters I1-I3, I5, I7 and I10, transfer gate TG1, and logic gate LG3 may be driven by the local power supply voltage VDDL.

Next, for example, referring to FIG. 6, the inverter I9 may include transistors MP3, MP4, MN3 and MN4 connected in series between the global power supply voltage VDDG and the ground voltage.

Specifically, the inverter I9 may include a transistor MP3 that is gated by the voltage level of the node E to transmit the global power supply voltage VDDG to the node C, a transistor MP4 that is gated by the output of the inverter I8 (that is a result obtained by actually inverting the voltage level of the node C) to transmit the global power supply voltage VDDG to the node C, a transistor MN3 that is gated by the output of the inverter I8 to provide a ground voltage to the node C, and a transistor MN4 that is gated by the voltage level of the node D to provide a ground voltage to the node C.

Although FIG. 6 illustrates only the inverter I9 as an example of a device that is driven using the global power supply voltage VDDG, other devices that utilize the global power supply voltage VDDG may also be driven by the global power supply voltage VDDG using the similar method. For example, inverter I8, and logic gates LG1 and LG2 may be driven by the global power supply voltage VDDG.

Meanwhile, the logic gate 80 illustrated in FIG. 4 may be variously provided by combining a plurality of transistors. Hereinafter, this will be more specifically described with reference to FIGS. 7 to 10.

FIGS. 7 to 10 are circuit diagrams of the logic gate of FIG. 4.

Hereinafter, various example embodiments of the logic gate 80 formed by combining a plurality of transistors will be first described with reference to FIGS. 7 and 8, and modified example embodiments will be described with reference to FIGS. 9 and 10.

Figure 7:
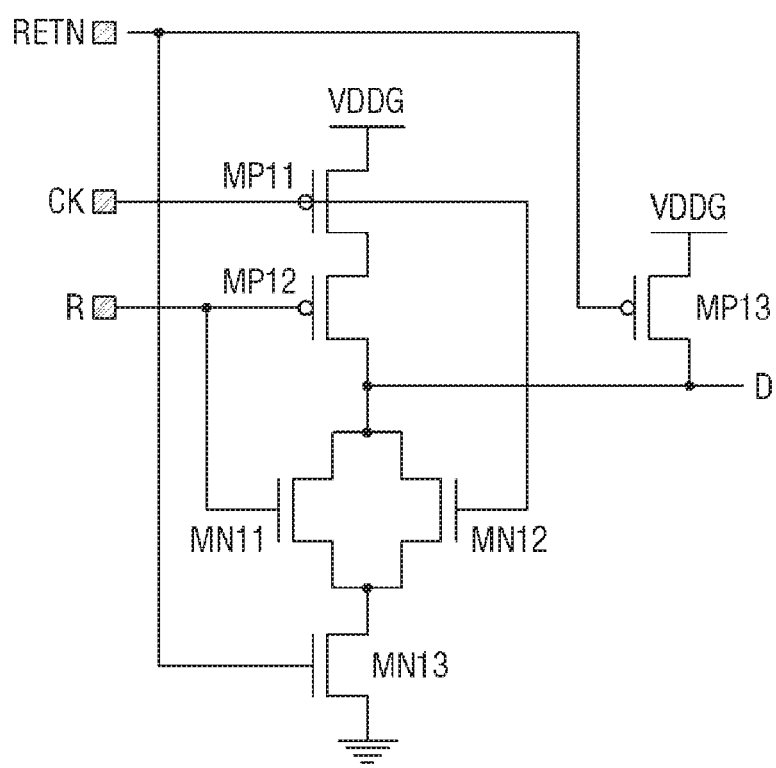
FIGS. 7 to 10 are circuit diagrams of the logic gate of FIG. 4.

First, referring to FIG. 7, the logic gate 80 may include a plurality of transistors MP11 to MP13 and MN11 to MN13 which are each gated by one of the clock signal CK, the reset signal R and the retention signal RETN.

A transistor MP11 may be gated by the clock signal CK and the transistor MP12 may be gated by the reset signal R to provide the global power supply voltage VDDG to the node D when transistors MP11 and MP12 are enabled. The transistor MP11 and the transistor MP12 may be connected in series to each other between the global power supply voltage VDDG and the node D, as illustrated.

A transistor MP13 may be gated by the retention signal RETN to provide the global power supply voltage VDDG to the node D. The transistor MP11, the transistor MP12 and the transistor MP13 may be connected in series to each other between the global power supply voltage VDDG and the node D, as illustrated.

A transistor MN12 may be gated by the clock signal CK to provide the ground voltage to the node D, and the transistor MN11 may be gated by the reset signal R to provide the ground voltage to the node D. The transistor MN12 and the transistor MN11 may be connected in parallel to each other between the ground voltage and the node D, as illustrated.

A transistor MN13 may be gated by the retention signal RETN to provide the ground voltage to the node D. The transistor MN12, the transistor MN11 and the transistor MN13 may heated in series to one another between the ground voltage and the node D, as illustrated.

Figure 8:
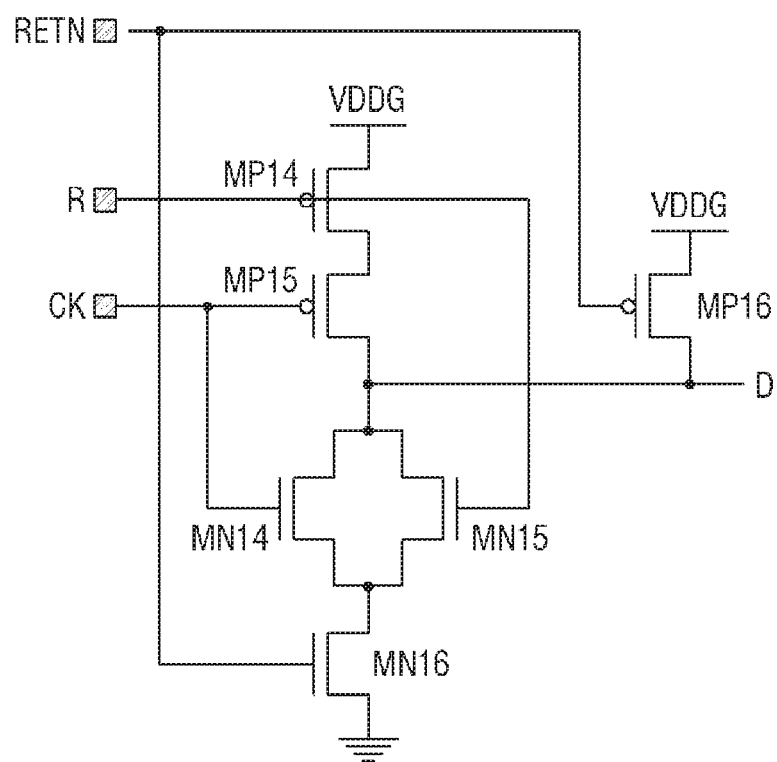

Next, referring to the FIG. 8, the logic gate 80 may include a plurality of transistors MP14 to MP16 and MN14 to MN16 that are each gated by one of the clock signal CK, the reset signal R and the retention signal RETN.

The transistor MP15 may be gated by the clock signal CK and the transistor MP14 may be gated by the reset signal R to provide the global power supply voltage VDDG to the node D when transistors MP14 and MP15 are enabled. The transistor MP15 and the transistor MP14 may be connected in series to each other between the global power supply voltage VDDG and the node D, as illustrated.

The transistor MP16 may be gated by the retention signal RETN to provide the global power supply voltage VDDG to the node D. The transistor MP14, the transistor MP15 and the transistor MP16 may be connected in parallel to one another between the global power supply voltage VDDG and the node D, as illustrated.

The transistor MN14 may be gated by the clock signal CK to provide a ground voltage to the node D, and the transistor MN15 may be gated by the reset signal R to provide the ground voltage to the node D. The transistor MN14 and the transistor MN15 may be connected in parallel to each other between the ground voltage and the node D, as illustrated.

The transistor MN16 may be gated by the retention signal RETN to provide a ground voltage to the node D. The transistor MN14, the transistor MN15 and the transistor MN16 may be connected in series to one another between the ground voltage and the node D, as illustrated.

Figure 9:
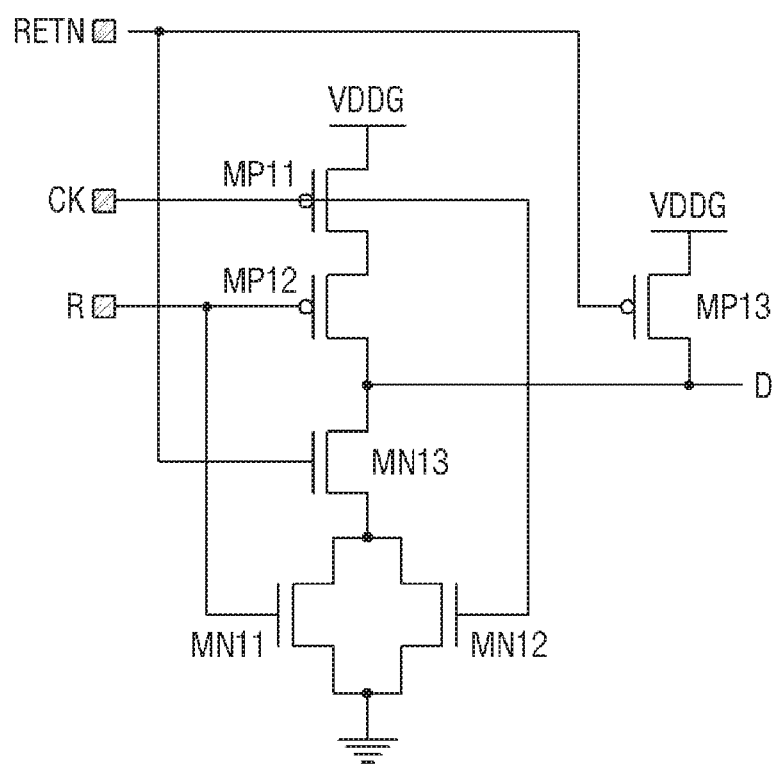

Next, FIG. 9 is a modified example embodiment of the example embodiment described with reference to FIG. 7. When comparing this modified example with the embodiment described referring to FIG. 7, the positions of the transistors MN11 to MN13 are modified. Specifically, although one terminals of the transistors MN11 and MN12 connected in parallel to each other between the node D and the ground voltage were directly connected to the node D in the embodiment described with reference to FIG. 7, one terminal of the transistor MN13 is directly connected to the node D in this modified example.

Figure 10:
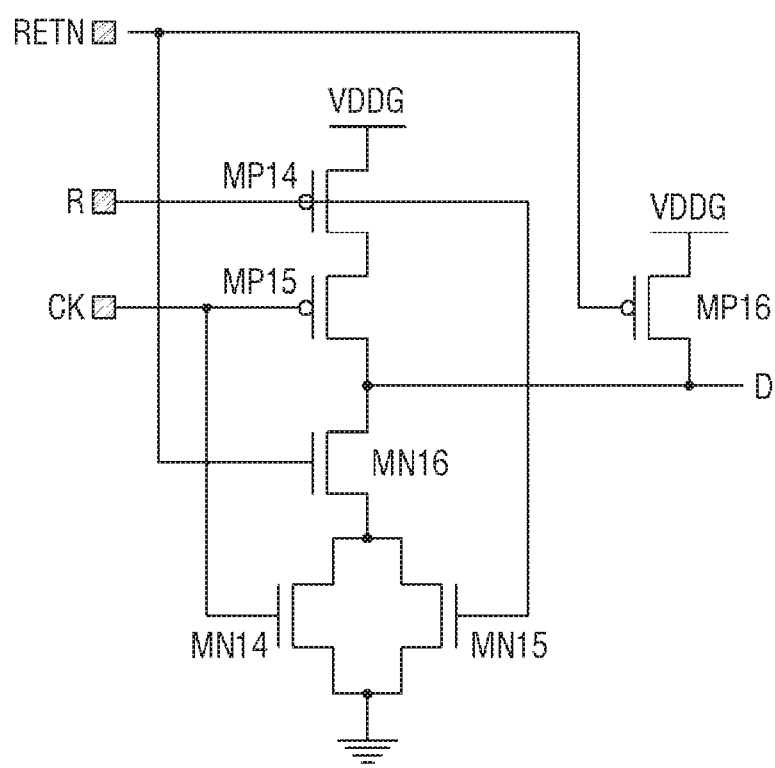

Next, FIG. 10 is a modified example embodiment of the example embodiment described with reference to FIG. 8. Similarly, when comparing this modified example with the embodiment described with reference to FIG. 8, the positions of the transistors MN14 to MN16 were modified. Specifically, although one terminals of the transistors MN14 and MN15 connected in parallel to one another between the node D and the ground voltage were directly connected to the node D in the embodiment described with reference to FIG. 8, one terminal of the transistor MN16 is directly connected to the node D in this modified example.

Figure 11:
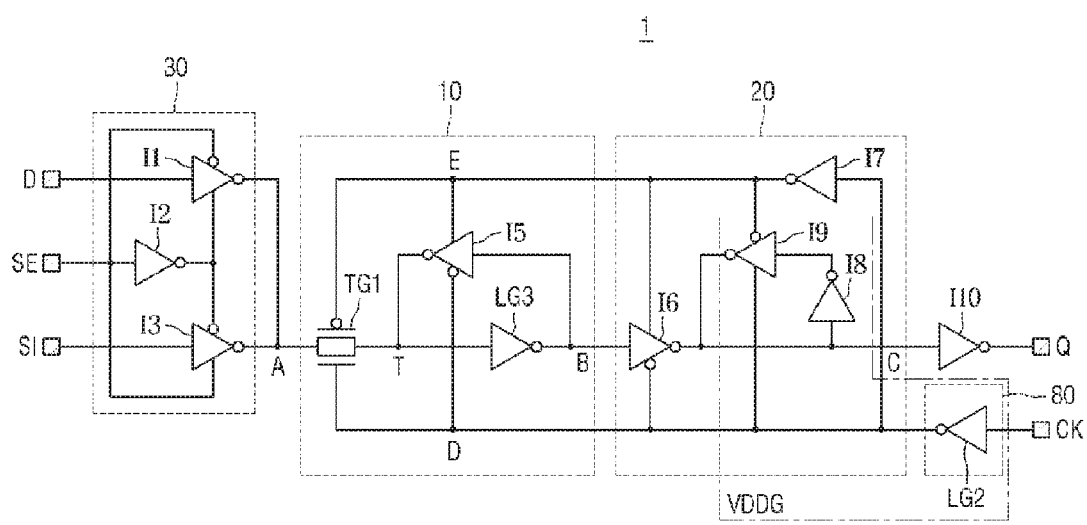
FIGS. 11 to 13 are diagrams for illustrating the operation of the retention reset flip-flop according to some example embodiments of the inventive concepts.
Figure 12:
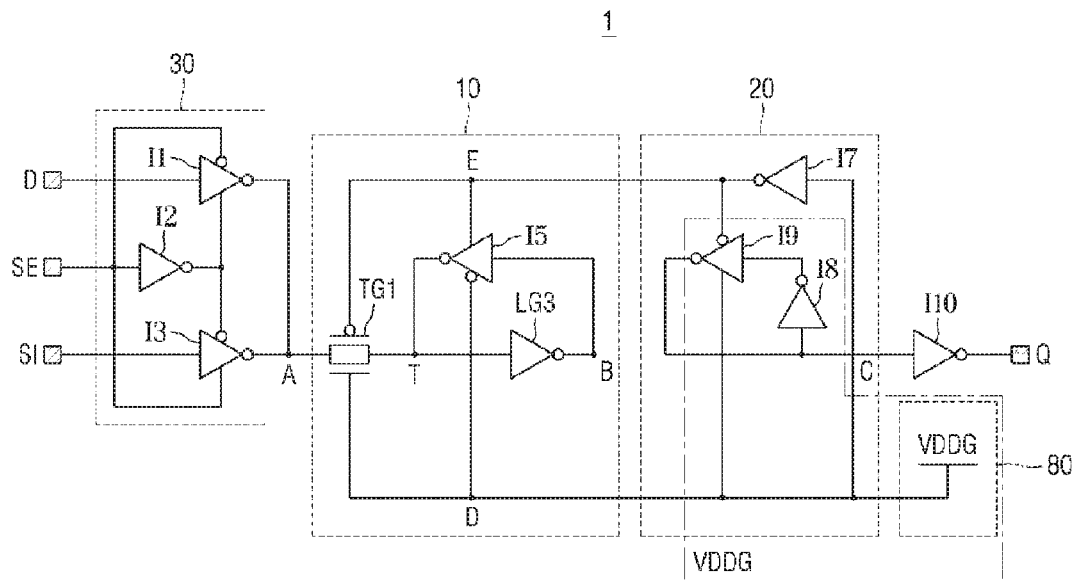
Figure 13:
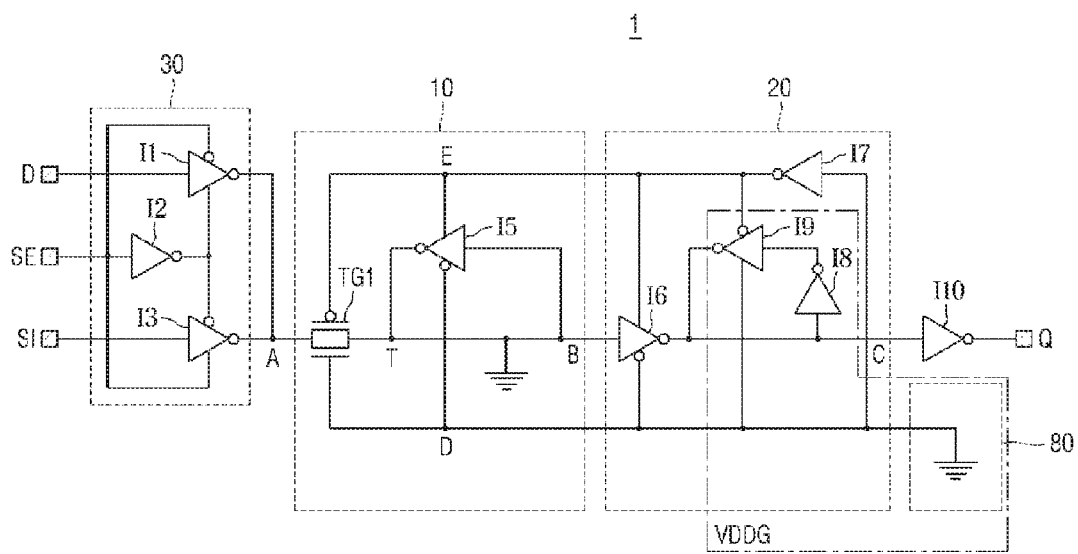

FIGS. 11 to 13 are diagrams for explaining the operation of the retention reset flip-flop according to some embodiments of the present inventive concept.

First, in the retention reset flip-flop illustrated in FIG. 4, the voltage levels of the respective nodes D, E and F may depend on the signal levels of the reset signal R, the clock signal CK and the retention signal RETN, as illustrated in Table 1 below.

TABLE 1

| Case | R | CK | RETN | Node F | Node D | Node E |
|---|---|---|---|---|---|---|
| 1 (Retention) | 0 | 0 | 0 | 0 | 1 | 0 |
| 2 (Normal F/F) | 0 | 0 | 1 | 0 | 1 | 0 |
| 3 (Retention) | 0 | 1 | 0 | 1 | 1 | 0 |
| 4 (Normal F/F) | 0 | 1 | 1 | 1 | 0 | 1 |
| 5 | 1 | 0 | 0 | 1 | 1 | 0 |
| 6 (Reset) | 1 | 0 | 1 | 1 | 0 | 1 |
| 7 | 1 | 1 | 0 | 1 | 1 | 0 |
| 8 (Reset) | 1 | 1 | 1 | 1 | 0 | 1 |

(Here, 1 indicates a state in which a signal (voltage) level is a high (H) logic, and 0 indicates a state in which a signal (voltage) level is a low (L) logic.)

Hereinafter, first, the description will be given of a case where the retention reset flip-flop 1 operates as the normal flip-flop with reference to Table 1 and FIG. 11.

The retention reset flip-flop 1 may operate as the normal flip-flop if the retention signal RETN and the reset signal R re inactivated. In the present example embodiment, the retention signal RETN may be considered inactivated when the signal level of the retention signal RETN is a high (H) logic, and the reset signal R may be inactivated when the signal level of the reset signal R is a low (L) logic. Accordingly, cases 2 and 4 of Table 1 correspond to the normal flip-flop operation.

Referring to Table 1, in the cases 2 and 4, the signal level of the clock signal CK and the voltage level of the node D are opposite to each other. That is, when the signal level of the clock signal CK is a high (H) logic, the voltage level of the node D becomes a low (L) logic, and when the signal level of the clock signal CK is a low (L) logic, the voltage level of the node D becomes a high (H) logic. That is, the logic gate 80 performs the functions of the inverter, as illustrated in FIG. 11. More specifically, since the voltage level of the node (F in FIG. 4) is the same as the signal level of the clock signal CK, the second logic gate LG2 may perform the functions of the inverter.

Meanwhile, since the reset signal R is inactivated, the third logic gate (LG3 in FIG. 4) that performs the NOR operation included in the master latch 10 operates only in cases 11 and 12 of table 2 below.

TABLE 2

| Case | R | Node T | LG3 (NOR gate) output = node B |
|---|---|---|---|
| 11 | 0 | 0 | 1 |
| 12 | 0 | 1 | 0 |
| 13 | 1 | 0 | 0 |
| 14 | 1 | 1 | 0 |

(Here, 1 indicates a state in which the signal (voltage) level is a high logic, and 0 indicates a state in which the signal (voltage) level is a low (L) logic.)

Referring to Table 2, in the cases 11 and 12, the voltage level of the node T and the voltage level of the node B become opposite to each other. That is, when the voltage level of the node T is a high (H) logic, the voltage level of the node B becomes a low (L) logic, and when voltage level of the node T is a low (L) logic, the voltage level of the node B becomes a high (H) logic. That is, the third logic gate LG3 performs the functions of the inverter as illustrated in FIG. 11.

As a result, the retention reset flip-flop 1 performs the normal flip-flop operation of latching and outputting the data signal D or the scan input signal SI on the basis of the clock signal CK.

Next, the description will be given of a case where the retention reset flip-flop 1 performs the retention operation with reference to Table 1 and FIG. 12.

The retention reset flip-flop 1 may perform the retention operation if the retention signal RETN is activated and the reset signal R is inactivated. In the present example embodiment, the retention signal RETN may be activated if the signal level of the retention signal RETN is a low (I) logic, and the reset signal R may be inactivated if the signal level of the reset signal R is a low (L) logic. Accordingly, the cases 1 and 3 of Table 1 correspond to the retention operation.

Referring to Table 1, in the cases 1 and 3, the voltage level of the node D always maintains the state of high (H) logic, irrespective of the signal level of the clock signal CK. That is, as illustrated in FIG. 12, the logic gate 80 performs a function of continuously providing the global power supply voltage VDDG to the node D.

Meanwhile, in the cases 1 and 3 of Table 1, because the voltage level of the node E always maintains the state of low (L) logic by the inverter I7, the inverter (I6 in FIG. 4) does not operate. Thus, the data stored in the master latch 10 is not transmitted to the slave latch 20, and the slave latch 20 performs the retention operation of preserving the data using the global power supply voltage VDDG.

Next, the description will be given of a case where the retention reset flip-flop 1 performs the reset operation with reference to Table 1, Table 2 and FIG. 13.

The retention reset flip-flop 1 may perform the reset operation if the retention signal RETN is inactivated and the reset signal R is activated. In the present example embodiment, the retention signal RETN may be inactivated if the signal level of the retention signal RETN is a high (H) logic, and the reset signal R may be activated if the signal level of the reset signal R is a high (H) logic. Accordingly, cases 6 and 8 of Table 1 correspond to these cases.

Referring to Table 1, in the cases 6 and 8, the voltage level of the node D always maintains the state of low (L) logic, irrespective of the signal level of the clock signal CK. That is, as illustrated in FIG. 13, the logic gate 80 performs the function of continuously providing the ground voltage to the node D.

Meanwhile, because the reset signal R is activated, the third logic gate (LG3 in FIG. 4) for performing the NOR operation included in the master latch 10 only operates in the cases 13 and 14 of Table 2.

Referring to Table 2, in the cases 13 and 14, the voltage level of the node B always maintains a low (L) logic, irrespective of the voltage level of the node T. That is, as illustrated in FIG. 13, the third logic gate LG3 performs the function of continuously providing the ground voltage to the node B.

Thus, the retention reset flip-flop 1 perform a reset operation of always outputting the low (L) logic signal to the output terminal Q, irrespective of the data latched to the master latch 10 and the slave latch 20.

In this way, the retention reset flip-flop 1 according to the present example embodiment can reliably perform the normal flip-flop operation, the retention operation and the reset operation, by utilizing the logic gate 80 that occupies a relatively small area in the device.

Figure 14:
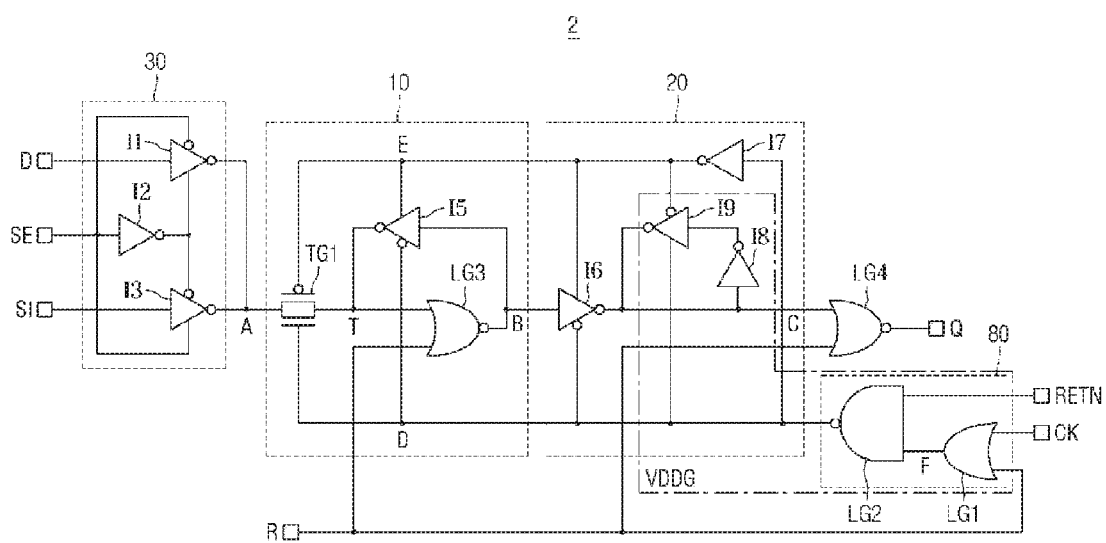
FIG. 14 is a circuit diagram of the retention reset flip-flop according to some example embodiments of the inventive concepts.

FIG. 14 is a circuit diagram of the retention reset flip-flop according to some example embodiments of the present inventive concepts. Hereinafter, the differences from the aforementioned example embodiments will be mainly described.

Referring to FIG. 14, a retention reset flip-flop 2 is different from the retention reset flip-flop 1 described with reference to FIG. 4 in that a fourth logic gate LG4 in place of the inverter (I10 of FIG. 4) is disposed at the output terminal Q.

The fourth logic gate LG4 may be a NOR gate that performs the NOR operation of the signal level of the reset signal R and the voltage level of the node C and outputs the result thereof.

When the reset signal R is inactivated, since the fourth logic gate LG4 performs the functions of the inverter as mentioned above, the retention reset flip-flop 2 may perform the normal flip-flop operation and the retention operation.

When the reset signal R is activated, since the fourth logic gate LG4 always provides the ground voltage to the output terminal Q, the retention reset flip-flop 2 may perform the reset operation.

In particular, in the retention reset flip-flop 2, when the reset signal R is activated, the fourth logic gate LG4 provides the ground voltage to the output terminal Q, irrespective of the signal level of the retention signal RETN, That is, even when the retention reset flip-flop 2 performs the retention operation (even when the retention signal RETN is activated), when the reset signal R is activated, the retention reset flip-flop 2 immediately performs the reset operation.

While example embodiments of the inventive concepts have been particularly illustrated and described with reference to some example embodiments thereof, it will be understood by those of ordinary skill in the art that various changes in form and detail may be made therein without departing from the idea and scope of the example embodiments of the present inventive concepts as defined by the following claims. The example embodiments should be considered in a descriptive sense only and not for purposes of limitation.

What is claimed is:

1. A semiconductor device comprising:
   a master latch configured to store a data signal based on a local power supply voltage and a clock signal, and to output the data signal as a first output signal;
   a slave latch configured to store the first output signal based on a global power supply voltage, the clock signal and a retention signal, and to output the first output signal as a second output signal, the global power supply voltage being supplied via a different voltage source from the local power supply voltage, the slave latch including an inverter configured to selectively invert the first output signal output by the master latch based on a second control signal such that the inverter is disabled in response to the second control signal;
   a first logic gate configured to generate a first control signal by performing a first logical operation on the clock signal and a reset signal; and
   a second logic gate configured to generate the second control signal by performing a second logical operation on the retention signal and the first control signal, and to provide the second control signal to at least one of the master latch and the slave latch, wherein
   the first logic gate is connected to the second logic gate such that the first control signal output by the first logic gate is directly provided to a node of the second logic gate, the second logic gate configured to output the second control signal to the inverter such that the inverter is enabled in response to the second control signal.

2. The semiconductor device of claim 1, wherein the slave latch is configured to,
   perform a reset operation by fixing the second output signal to a set signal level, if the reset signal is activated, and
   determine a signal level of the second output signal based on a signal level of the data signal, if the reset signal is inactivated.

3. The semiconductor device of claim 1, wherein
   the first logical operation includes an OR operation, and
   the second logical operation includes a NAND operation.

4. The semiconductor device of claim 1, wherein the first logic gate comprises:
   an OR gate configured to generate the first control signal by performing an OR operation on the reset signal and the clock signal, and to provide the first control signal to the second logic gate.

5. The semiconductor device of claim 4, wherein the second logic gate comprises:
   a NAND gate configured to generate the second control signal by performing a NAND operation on the retention signal and the first control signal, and to provide the second control signal to at least one of the master latch and the slave latch.

6. The semiconductor device of claim 1, wherein the semiconductor device is configured to supply the global power supply voltage to the first logic gate and the second logic gate.

7. The semiconductor device of claim 1, further comprising:
   a third logic gate configured to perform a third logical operation on the reset signal and the second output signal, the third logical operation being a different logical operation from the first logical operation and the second logical operation.

8. The semiconductor device of claim 7, wherein the third logical operation comprises:
a NOR operation on the reset signal and the second output signal.

9. The semiconductor device of claim 1, wherein, the slave latch is configured to,
perform a retention operation, if the retention signal is activated and the reset signal is inactivated, and
perform a reset operation, if the retention signal is inactivated and the reset signal is activated.

10. A semiconductor device configured to receive at least a global power supply voltage via a first line, and a local power supply voltage via a second line, the semiconductor device comprising:
a first operating circuit configured to selectively receive the local power supply voltage via the second line, and to operate based on the local power supply voltage;
a first power gating circuit configured to determine whether to supply the local power supply voltage to the first operating circuit via the second line; and
a first retention reset flip-flop connected to the first line and the second line, the first retention reset flip-flop including,
a master latch configured to operate using the local power supply voltage to store a data signal based on a clock signal, a retention signal and a reset signal, and to output the data signal as a first output signal;
a slave latch configured to operate using the global power supply voltage to store the first output signal based on the clock signal, the retention signal and the reset signal, and to output the first output signal as a second output signal, the slave latch including an inverter configured to selectively invert the first output signal output by the master latch based on a control signal such that the inverter is disabled in response to the control signal; and
at least one logic gate configured to generate the control signal by performing at least one logical operation on the retention signal, the clock signal and the reset signal, and to provide the control signal to at least one of the master latch and the slave latch, the at least one logic gate including,
a first logic gate configured to perform a first logical operation, and
a second logic gate connected to an output of the first logic gate, the second logic gate configured to perform a second logical operation on the output of the first logic gate, the second logical operation being different than the first logical operation, wherein
the first logic gate is connected to the second logic gate such that the first output signal output by the first logic gate is directly provided to a node of the second logic gate, the second logic gate configured to output the control signal to the inverter such that the inverter is enabled in response to the control signal.

11. The semiconductor device of claim 10, wherein the at least one logic gate is connected to the first line.

12. The semiconductor device of claim 10 wherein
the first logic gate includes an OR gate configured to perform an OR operation on the reset signal and the clock signal, and the second logic gate includes a NAND gate configured to perform a NAND operation on an output of the OR gate and the retention signal.

13. The semiconductor device of claim 10, further comprising:
a second operating circuit configured to operate using the local power supply voltage received via a third line, the third line being a separate transmission line from the second line;
a second power gating circuit configured to determine whether to apply the local power supply voltage to the second operating circuit; and
a second retention reset flip-flop connected to the first line and the third line.

14. A semiconductor device comprising:
a power gating circuit configured to selectively supply a local power supply voltage to an operating circuit; and
a retention reset flip-flop configured to,
operate in a normal flip-flop mode to latch data using at least the local power supply voltage, when the power gating circuit supplies the local power supply voltage to the operating circuit, and
operate in a retention mode to preserve the data using a global power supply voltage, when the power gating circuit cuts off the local power supply voltage to the operating circuit, the global power supply voltage being supplied via a different voltage source from the local power supply voltage, the retention reset flip-flop including,
a master latch configured to latch the data using the local power supply voltage, and to output a data signal as a first output signal based on a clock signal,
a slave latch configured to retain the data using the global power supply voltage based on a retention signal, the slave latch including an first inverter including an input terminal configured to receive the first output signal output by the master latch, an enable terminal configured to receive a control signal that varies based on the retention signal, a reset signal and a clock signal, and an output terminal, the first inverter configured to selectively invert the first output signal output by the master latch to the input terminal based on the control signal input to the enable terminal such that the first inverter is disabled in the retention mode, and
at least one logic gate configured to generate the control signal based on the retention signal, the reset signal and the clock signal to instruct the retention reset flip-flop to operate in one of the normal flip-flop mode and the retention mode such that the at least one logic gate is configured to output the control signal to the first inverter such that the first inverter is enabled the normal flip-flop mode.

15. The semiconductor device of claim 14, wherein the at least one logic gate is configured to generate the control signal based on the retention signal, the clock signal and the reset signal such that a logic level of the control signal is opposite a logic level of the clock signal, if the retention reset flip-flop is operating in the normal flip-flop mode, and the logic level of the control signal is fixed irrespective of the logic level of the clock signal, if the retention reset flip-flop is operating in the retention mode.

16. The semiconductor device of claim 15, wherein the at least one logic gate comprises:

an OR gate configured to generate an intermediate control signal by performing an OR operation on the reset signal and the clock signal; and a NAND gate configured to generate the control signal by performing a NAND operation on the retention signal and the intermediate control signal.

17. The semiconductor device of claim 15, wherein the slave latch comprises:

a second inverter including an input terminal and an output terminal, the input terminal of the second inverter connected to the output terminal of the first inverter; and a third inverter including an input terminal and an output terminal, the input terminal of the third inverter connected to the output terminal of the second inverter and the output terminal of the third inverter connected to the output terminal of the first inverter.

* * * * *